US010204258B2

(12) United States Patent
Tan (10) Patent No.: US 10,204,258 B2
(45) Date of Patent: Feb. 12, 2019

(54) OUTPUT CONVERSION CIRCUIT AND FINGERPRINT IDENTIFICATION SYSTEM

(71) Applicant: Shenzhen Goodix Technology Co., Ltd., Shenzhen (CN)

(72) Inventor: Bo Tan, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 28 days.

(21) Appl. No.: 15/490,885

(22) Filed: Apr. 18, 2017

(65) Prior Publication Data

US 2017/0220849 A1    Aug. 3, 2017

Related U.S. Application Data

(63) Continuation of application No. PCT/CN2016/071681, filed on Jan. 21, 2016.

(30) Foreign Application Priority Data

Oct. 21, 2015   (CN) .......................... 2015 1 0688542

(51) Int. Cl.
*G06K 9/28*      (2006.01)
*G06K 9/00*      (2006.01)
(Continued)

(52) U.S. Cl.
CPC ....... *G06K 9/00087* (2013.01); *G06K 9/0002* (2013.01); *G06F 3/044* (2013.01); *H03M 1/0665* (2013.01)

(58) Field of Classification Search
CPC ... G06K 9/00013–9/001; G06K 9/0002; G06F 7/58–7/588
See application file for complete search history.

(56) References Cited

U.S. PATENT DOCUMENTS 7,176,822 B2    2/2007  Schimper
2005/0270202 A1  12/2005  Haartsen
(Continued)

FOREIGN PATENT DOCUMENTS

CN       1801627 A     7/2006
CN     101344917 A     1/2009
(Continued)

OTHER PUBLICATIONS

Office Action and Supplemental Search Report for corresponding CN Application No. 201510688542.7, Applicant: Shenzhen Goodix Technology Co., Ltd., Aug. 23, 2017, 6 pages.
(Continued)

*Primary Examiner* — Brian Werner (57) ABSTRACT

The present disclosure provides an output conversion circuit and a fingerprint identification system. The output conversion circuit includes: a comparator, a counter, and a reference signal generator, where the comparator includes: a first input end, configured to receive a first output signal; a second input end; and an output end, configured to generate a comparison output signal; the counter is connected to the output end of the comparator, and configured to generate a second output signal; and the reference signal generator is connected to the second input end, and configured to generate a reference signal, where the reference signal generator includes a random digit generator configured to generate a random digit, and the reference signal is associated with the random digit; where the comparator generates the comparison output signal according to the first output signal and the reference signal.

11 Claims, 6 Drawing Sheets

(51) Int. Cl.
*G06F 3/044* (2006.01)
*H03M 1/06* (2006.01)

(56) References Cited

U.S. PATENT DOCUMENTS

| | | | |
|---|---|---|---|
| 2006/0020647 A1* | 1/2006 | Simon | G06F 7/58 |
| | | | 708/250 |
| 2006/0077090 A1 | 4/2006 | Schimper | |
| 2006/0155551 A1 | 7/2006 | Ueda | |
| 2008/0317300 A1* | 12/2008 | Pai | G06K 9/0002 |
| | | | 382/124 |

FOREIGN PATENT DOCUMENTS

| CN | 101490566 A | 7/2009 |
|---|---|---|
| CN | 102685405 A | 9/2012 |
| CN | 104133658 A | 11/2014 |
| CN | 104298962 A | 1/2015 |
| CN | 104393856 A | 3/2015 |
| KR | 10-2015-0117398 A | 10/2015 |
| WO | 2004/077669 A1 | 9/2004 |

OTHER PUBLICATIONS

Office Action of corresponding KR Application No. 10-2017-7012243, Applicant: Shenzhen Goodix Technology Co., Ltd., dated Oct. 1, 2017, 8 pages.
International Search Report for corresponding International Application No. PCT/CN2016/071661, Applicant: Shenzhen Huiding Technology Co., Ltd., Jul. 25, 2016, 4 pages.
Office Action for corresponding Chinese Application No. 201510668542.7, Applicant: Shenzhen Huiding Technology Co., Ltd., Apr. 18, 2017, 5 pages.
Supplementary European Search Report for corresponding EP Application No. 16856557, Applicant: Shenzhen Goodix Technology Co., Ltd., Dec. 13, 2017, 8 pages.

* cited by examiner

OUTPUT CONVERSION CIRCUIT AND FINGERPRINT IDENTIFICATION SYSTEM

CROSS-REFERENCE TO RELATED APPLICATIONS

The present application is a continuation of international application No. PCT/CN2016/071681, filed on Jan. 21, 2016, which claims priority to Chinese Patent Application No. CN 201510688542.7, filed on Oct. 21, 2015, both of which are hereby incorporated by reference in their entireties.

TECHNICAL FIELD

The present disclosure relates to an output conversion circuit and a fingerprint identification system, and particularly to an output conversion circuit and a fingerprint identification system capable of improving statistical linearity of an output signal.

BACKGROUND

As technology advances, more and more portable electronic devices, such as mobile phones, digital cameras, tablet computers, laptops, and the like, have become necessary tools for people in life. Since the portable electronic device is commonly for personal use and has a certain of privacy, data stored therein, such as a telephone book, photos, personal information, and the like, are owned privately. Once the electronic device is lost, these data may be utilized by others, resulting in unnecessary losses. Although there is a way of utilizing password protection to avoid the electronic device from being used by others currently, the password is easily leaked and cracked, and has lower security. In addition, a user needs to remember the password to use the electronic device, and if the password is forgotten, it will bring the user a lot of inconvenience. Therefore, a way of utilizing a personal fingerprint identification system is developed currently to achieve an objective of identity authentication so as to improve data security.

Generally, a touch from a finger is received with a pixel array circuit in a fingerprint identification system, and the pixel array circuit converts a capacitance between the pixel array circuit and the finger into a pixel output signal. Affected by a noise, the pixel output signal does not possess good statistical linearity, which is not conducive to back-end image processing. Therefore, how to improve statistical linearity of an output signal in a fingerprint identification system has become one of goals of the industry.

SUMMARY

The present disclosure provides an output conversion circuit and a fingerprint identification system capable of improving statistical linearity of an output signal.

To solve the foregoing technical problem, the present disclosure provides an output conversion circuit, including: a comparator, a counter, and a reference signal generator; the comparator includes: a first input end, configured to receive a first output signal; a second input end; and an output end, configured to generate a comparison output signal; the counter is connected to the output end of the comparator, and configured to generate a second output signal; the reference signal generator is connected to the second input end, and configured to generate a reference signal, where the reference signal generator includes a random digit generator configured to generate a random digit, and the reference signal is associated with the random digit; and the comparator generates the comparison output signal according to the first output signal and the reference signal.

According to one implementation of the present disclosure, the reference signal is a signal that varies randomly with time, and the random digit is in uniform distribution.

According to one implementation of the present disclosure, the reference signal generator includes a control circuit outputting a reference voltage, and the reference voltage has a fixed voltage value.

According to one implementation of the present disclosure, the reference signal is associated with a sum of the reference voltage and the random digit.

According to one implementation of the present disclosure, the reference signal generator further includes a digital-to-analog converter, configured to convert the sum of the reference voltage and the random digit into an analog reference signal.

According to one implementation of the present disclosure, the comparison output signal is a first electric potential when the first output signal is greater than the reference signal, and the comparison output signal is a second electric potential when the first output signal is less than the reference signal.

According to one implementation of the present disclosure, the output conversion circuit is used for a fingerprint identification system including a pixel array circuit, and the first input end is connected to the pixel array circuit.

According to one implementation of the present disclosure, the pixel array circuit includes at least one pixel circuit.

According to one implementation of the present disclosure, the pixel array circuit is configured to receive a touch from a finger and convert a capacitance formed between the pixel array circuit and the finger into a pixel output signal, and the pixel output signal is associated with the first output signal.

According to one implementation of the present disclosure, the fingerprint identification system further includes an amplifier connected between the pixel array circuit and the first input end, and configured to enhance signal intensity of the pixel output signal to form the first output signal.

To solve the foregoing technical problem better, the present disclosure further provides a fingerprint identification system including a pixel array circuit configured to receive a touch from a finger and convert a capacitance formed between the pixel array circuit and the finger into a pixel output signal; an output conversion circuit configured to generate a second output signal according to a first output signal, where the output conversion circuit includes a comparator including: a first input end configured to receive the first output signal; a second input end; and an output end configured to generate a comparison output signal. The fingerprint identification system also comprises a counter, connected to the output end of the comparator, and configured to generate the second output signal; a reference signal generator, connected to the second input end, and configured to generate a reference signal, where the reference signal generator includes a random digit generator configured to generate a random digit, and the reference signal is associated with the random digit; and a fingerprint determination module, connected to the output conversion circuit, and configured to determine whether the pixel output signal corresponds to a finger ridge or a finger valley according to the second output signal; where the first output signal is associated with the pixel output signal, and the comparator generates the comparison output signal according to the first output signal and the reference signal.

The output conversion circuit provided in the present disclosure changes a signal value of a reference signal with a random digit generator such that a first output signal with poor statistical linearity is converted into a second output signal with good statistical linearity, and sends the second output signal to a back-end image processing module to facilitate back-end image processing.

DESCRIPTION OF EMBODIMENTS

To make objectives, technical solutions and advantages of the present disclosure clearer, the following further describes the present disclosure with reference to the accompanying drawings and embodiments in detail. It should be understood that the specific embodiments described herein are merely used to explain the present disclosure, and are not used to limit the present disclosure.

Figure 1:
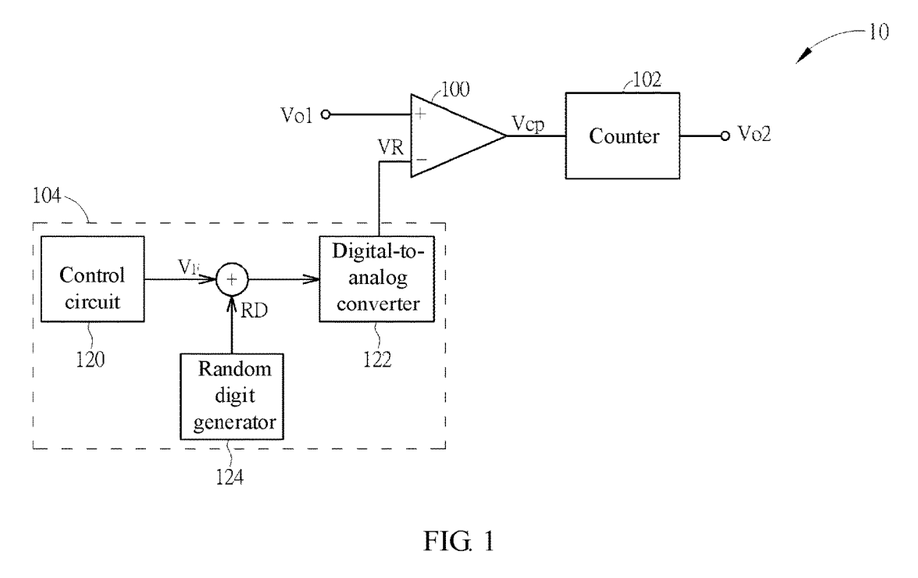
FIG. 1 is a schematic diagram of an output conversion circuit of an embodiment of the present disclosure.

FIG. 1 is a schematic diagram of an output conversion circuit 10 of an embodiment of the present disclosure. The output conversion circuit 10 is configured to convert a first output signal Vo1 into a second output signal Vo2, and the output conversion circuit 10 includes a comparator 100, a counter 102 and a reference voltage generator 104. The comparator 100 includes a negative input end (marked with ⌈−⌉), a positive input end (marked with ⌈+⌉) and an output end, where the positive input end (i.e., a first input end of the comparator) is configured to receive the first output signal Vo1; the negative input end (i.e., a second input end of the comparator) is connected to the reference voltage generator 104, and configured to receive a reference signal VR. The comparator 100 generates a comparison output signal Vcp according to the first output signal Vo1 and the reference signal VR, and outputs the comparison output signal Vcp through the output end; the comparison output signal Vcp may be either a logic "0" or a logic "1". In an embodiment, the comparison output signal Vcp is the logic "1" (corresponding to a first electric potential) when the first output signal Vo1 is greater than the reference signal VR; and the comparison output signal Vcp is the logic "0" (corresponding to a second electric potential) when the first output signal Vo1 is less than the reference signal VR. The counter 102 is connected to the output end of the comparator 100, and configured to generate the second output signal Vo2 by accumulating the comparison output signal Vcp; i.e., the second output signal Vo2 is an accumulative result of the comparison output signal Vcp. The reference voltage generator 104 includes a control circuit 120, a random digit generator 124 and a digital-to-analog converter 122; the control circuit 120 is configured to generate a digital fixed voltage $V_F$, the random digit generator 124 is configured to generate a digital random digit RD, and the digital-to-analog converter 122 is configured to convert a sum of the fixed voltage $V_F$ and the random digit RD into an analog reference signal VR. Preferably, the random digit RD is in uniform distribution (Uniform Distribution).

The following described is a working principle of the output conversion circuit 10. The first output signal Vo1 includes a useful signal sig and a noise noi, i.e., the first output signal Vo1 is a result of summing the useful signal sig and the noise noi, and a mathematical expression thereof may be expressed as Vo1=sig+noi, where the noise noi may be regarded as a random variable, and a cumulative density function F(a) of the first output signal Vo1 represents ⌈a probability that the first output signal Vo1 is less than a specific value a⌋. It should be noted that statistical linearity of the first output signal Vo1 is poor since the noise noi is usually in non-uniform distribution (Non-uniform Distribution); in other words, for a fixed interval Δ, a probability of the fixed interval Δ in the vicinity of the specific value a is different from a probability of the fixed interval Δ in the vicinity of anther specific value b, for example F(a+Δ)−F(a)≠F(b+Δ)−F(b).

Figure 3:
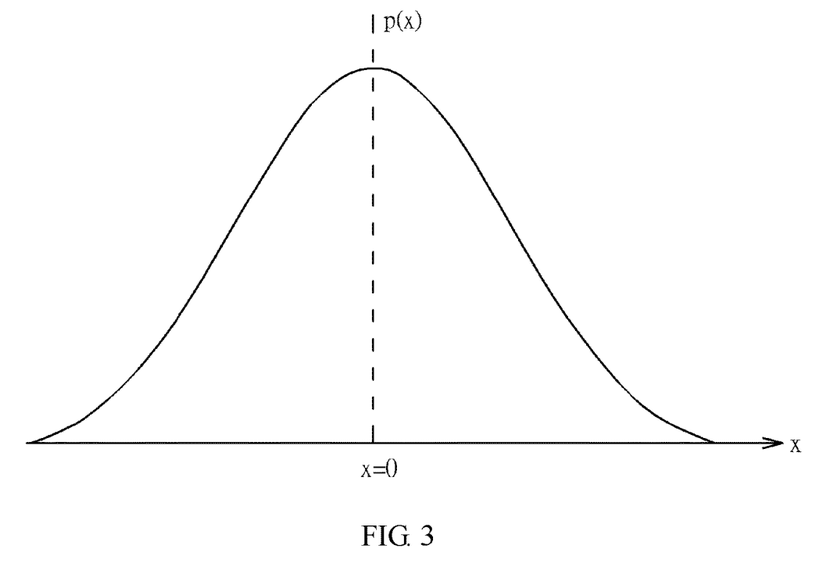
FIG. 3 is a schematic diagram of a probability density function of a noise.
Figure 4:
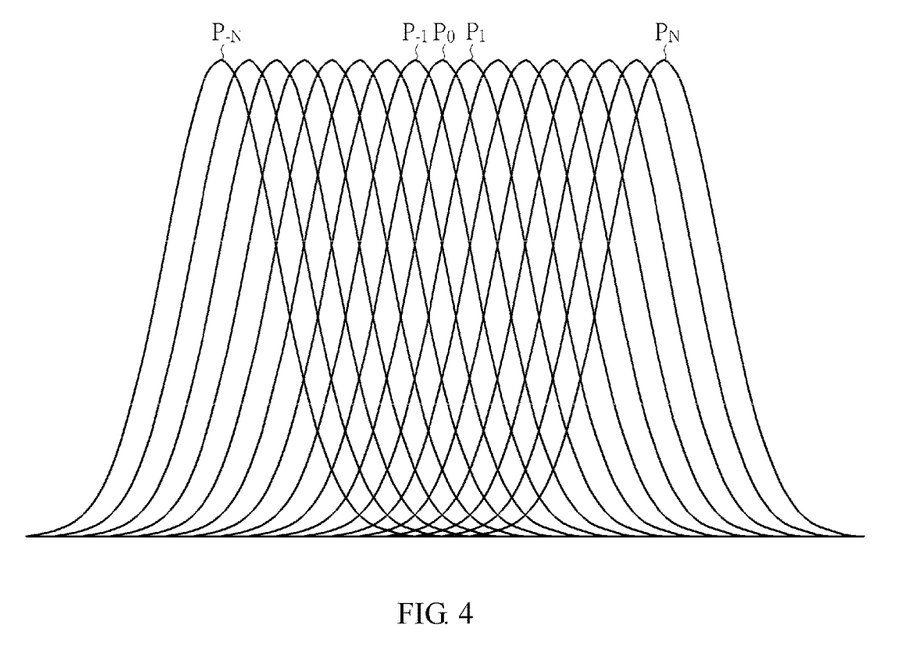
FIG. 4 is a schematic diagram of a plurality of Gaussian functions.
Figure 5:
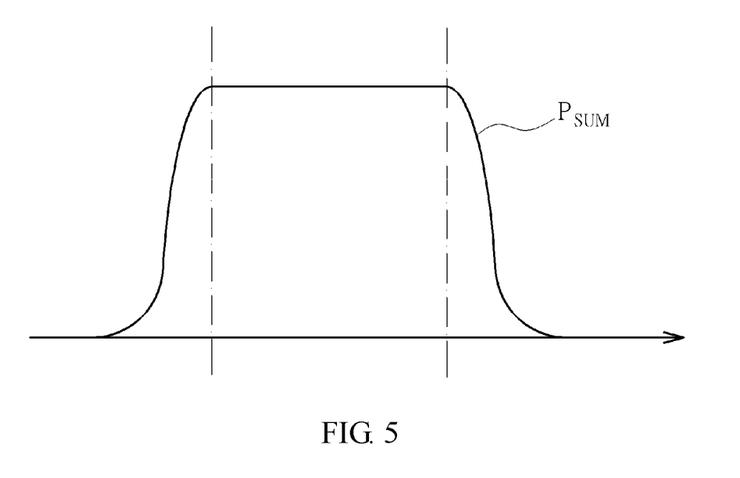
FIG. 5 is a schematic diagram of a sum function.

In other words, one of main reasons for poor statistical linearity of the first output signal Vo1 is that the noise noi is in non-uniform distribution. Taking the noise noi being in Gaussian Distribution as an example, as shown in FIG. 3, a probability density function p(x) of the noise noi has non-uniformity at a center (x=0), thus resulting in the poor statistical linearity of the first output signal Vo1. To solve a problem of non-uniformity of a probability density function, a plurality of probability density functions with translations may be superposed on each other, and a sum function superposed has a characteristic of uniform distribution. In particular, FIG. 4 is a schematic diagram of Gaussian functions $p_{-N} \sim p_N$, and FIG. 5 is a schematic diagram of a sum function $p_{SUM}$. In FIG. 4, a Gaussian function po represents a Gaussian function whose center is 0, Gaussian functions $p_{-N} \sim p_{-1}$ represent a plurality of Gaussian functions with left translations from the Gaussian function $p_0$, and Gaussian functions $p_1 \sim p_n$ represent a plurality of Gaussian functions with right translations from the Gaussian function $p_0$. It should be noted that the sum function $p_{SUM}$ is a result after superposing all Gaussian functions $p_{-N} \sim p_N$ on each other, and it is known from FIG. 5 that the sum function $p_{SUM}$ has a characteristic of uniform distribution at the center thereof.

Figure 6:
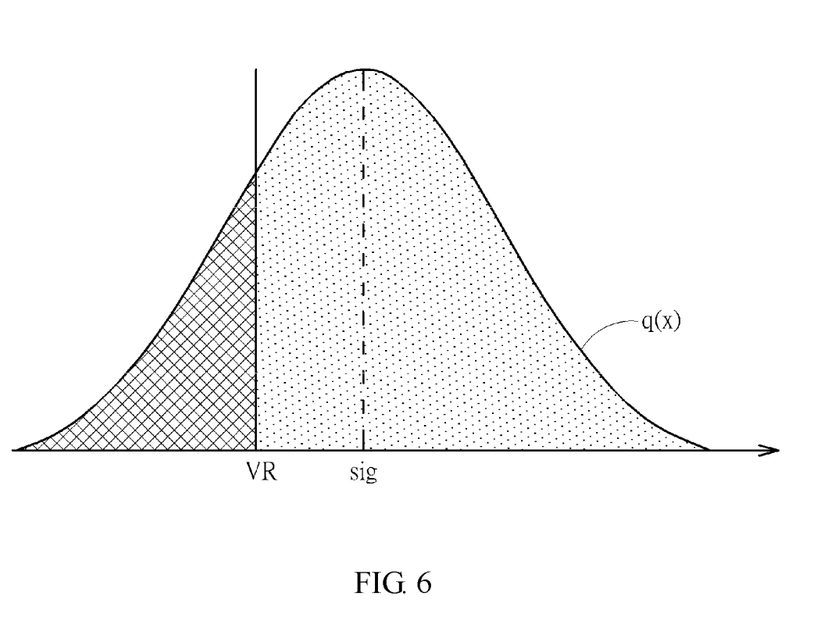
FIG. 6 is a schematic diagram of a probability density function of a first output signal.

On the other hand, an effect of translating the probability density function of the noise noi may be achieved by changing a signal value of the reference signal VR (changing the signal value of the reference signal VR may be performed by the random digit generator 124). Particularly, referring to FIG. 6, FIG. 6 is a schematic diagram of a probability density function q(x) of the first output signal Vo1. The probability density function q(x) takes the useful signal sig of the first output signal Vo1 as a center, a probability that the comparison output signal Vcp is the logic 0 is equal to a probability that the first output signal Vo1 is less than the reference signal VR (the mesh gridlines region in FIG. 6), and a probability that the comparison output signal Vcp is the logic 1 is a probability that the first output signal Vo1 is greater than the reference signal VR (the dot-like distribution region in FIG. 6). Actually, in a case where a signal value of the useful signal sig cannot be changed, changing the signal value of the reference signal VR is equivalent to translating the probability density function q(x) to the left or to the right. Particularly, increasing the signal value of the reference signal VR is equivalent to translating the probability density function of the first output signal Vo1 to the left, and reducing the signal value of the reference signal VR is equivalent to translating the probability density function of the first output signal Vo1 to the right, where changing the signal value of the reference signal VR may be performed by the random digit generator 124. Further, since the second output signal Vo2 is an accumulative result of the comparison output signal Vcp, a probability density function of the second output signal Vo2 may be regarded as an accumulated result of the probability density function q(x) with a translation, which has a characteristic of uniform distribution as shown in FIG. 5, and thus the second output signal Vo2 may have good statistical linearity.

It is known from the foregoing description that the output conversion circuit 10 provided in the present disclosure changes the signal value of the reference signal VR with the random digit generator 124 such that the first output signal Vo1 with the poor statistical linearity is converted into the second output signal Vo2 with the good statistical linearity, and sends the second output signal Vo2 to a back-end image processing module such that the second output signal Vo2 with the good statistical linearity facilitates back-end image processing.

Figure 2:
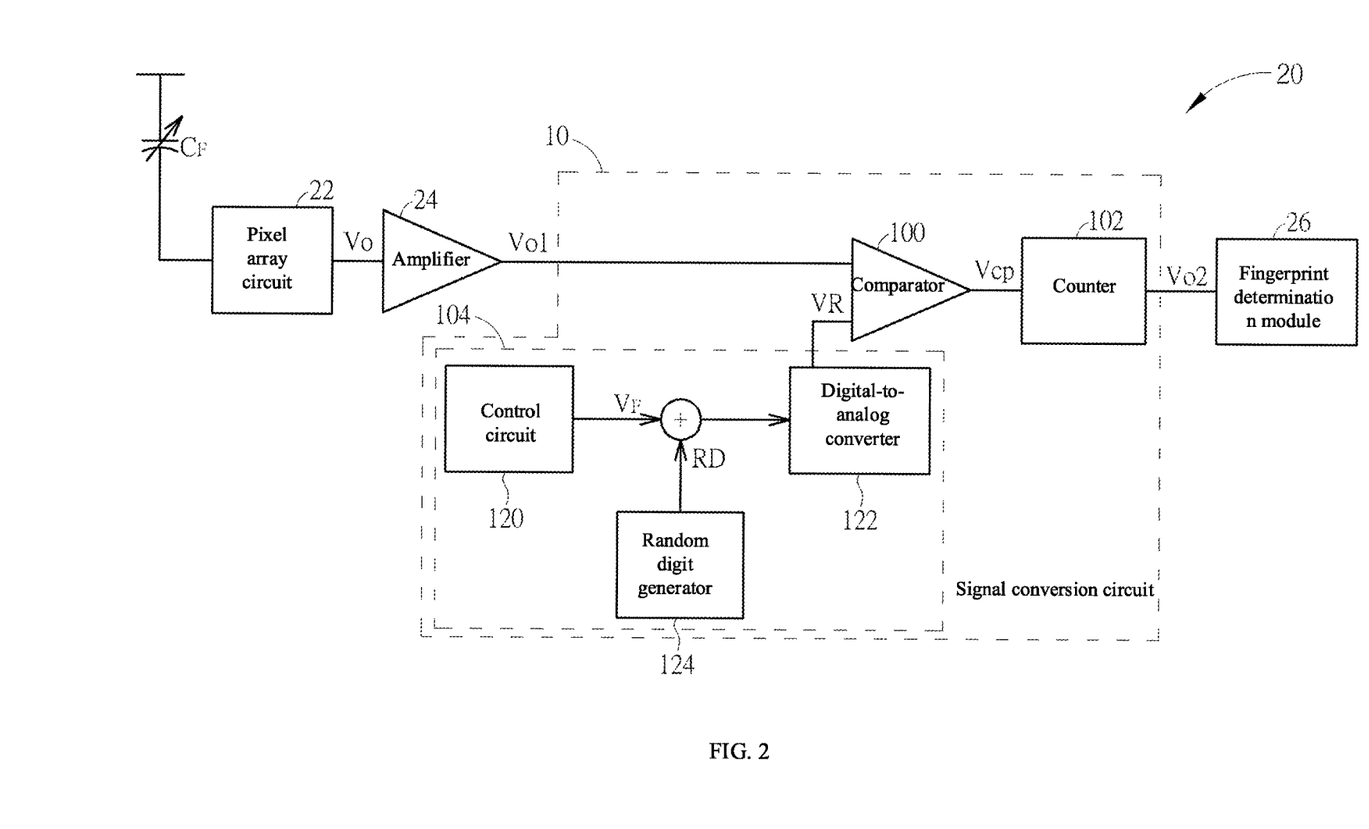
FIG. 2 is a schematic diagram of a fingerprint identification system of an embodiment of the present disclosure.

On the other hand, an output conversion circuit 10 may be applied to a fingerprint identification system. FIG. 2 is a schematic diagram of a fingerprint identification system 20 of an embodiment of the present disclosure, which applies the output conversion circuit 10, and includes a pixel array circuit 22, an amplifier 24 and a fingerprint determination module 26. The pixel array circuit 22 is configured to receive a touch from a finger, and convert a touch capacitance $C_F$ between the pixel array circuit 22 and the finger into a pixel output signal Vo. The amplifier 24 is connected to the pixel array circuit 22, and configured to enhance signal intensity of the pixel output signal Vo to form a first output signal Vo1, where the first output signal Vo1 is a signal obtained by enhancing the output signal Vo through the amplifier 24. A positive input end of a comparator 100 in the output conversion circuit 10 is connected to the amplifier 24, and the comparator 100 generates a comparison output signal Vcp according to the first output signal Vo1 and a reference signal VR. The output conversion circuit 10 is configured to convert the first output signal Vo1 with poor statistical linearity into a second output signal Vo2 with good statistical linearity. The second output signal Vo2 is output to the fingerprint determination module 26, and the fingerprint determination module 26 determines whether the pixel output signal Vo corresponds to a finger ridge (Finger Ridge) or a finger valley (Finger Valley) according to the second output signal Vo2.

It should be noted that the foregoing embodiments are intended to illustrate the concept of the present disclosure, and those skilled in the art having the common knowledge may perform different modifications based on the foregoing description, without being limited thereto. For example, the amplifier 24 is merely configured to enhance the signal intensity of the pixel output signal Vo, without being limited thereto; in the case where the signal intensity of the pixel output signal is sufficient, the fingerprint identification system may directly connect the positive input end of the comparator to the pixel array circuit, which also belongs to the scope of the present disclosure. In addition, the random digit generator may be implemented with a dither (Dither), without being limited herein.

In conclusion, the present disclosure changes a signal value of a reference signal with a random digit generator such that a first output signal with poor statistical linearity is converted into a second output signal with good statistical linearity, and sends the second output signal to a back-end image processing module to facilitate back-end image processing.

The foregoing description is merely preferable embodiments of the present disclosure, which is not intended to limit the present disclosure. Any amendments, equivalent substitutions and improvements made under the spirit and principal of the present disclosure shall be included in the protection scope of the present disclosure.

What is claimed is:

1. An output conversion circuit, comprising:
   a comparator, comprising:
      a first input end, configured to receive a first output signal;
      a second input end; and
      an output end, configured to generate a comparison output signal;
   a counter, connecting to the output end of the comparator, and configured to count an accumulative result of the comparison output signal to generate a second output signal; and
   a reference signal generator, connecting to the second input end, and configured to generate a reference signal, wherein the reference signal generator comprises a control circuit configured to generate a fixed voltage, a random digit generator configured to generate a random digit and an adder configured to add the fixed voltage to the random digit so that the reference signal is associated with a sum of the fixed voltage and the random digit, wherein the reference signal is a signal that varies randomly with time, and the random digit generator produces a uniform distribution of digits over time;
   wherein the comparator generates the comparison output signal according to the first output signal and the reference signal.

2. The output conversion circuit according to claim 1, wherein the reference signal generator further comprises a digital-to-analog converter configured to convert the sum of the reference voltage and the random digit into an analog reference signal.

3. The output conversion circuit according to claim 1, wherein the comparison output signal is a first electric potential when the first output signal is greater than the reference signal, and the comparison output signal is a second electric potential when the first output signal is less than the reference signal.

4. The output conversion circuit according to claim 1, wherein the output conversion circuit is used for a fingerprint identification system comprising a pixel array circuit, and the first input end is connected to the pixel array circuit.

5. The output conversion circuit according to claim 4, wherein the pixel array circuit comprises at least one pixel circuit.

6. The output conversion circuit according to claim 4, wherein the pixel array circuit is configured to receive a touch from a finger and convert a capacitance formed between the pixel array circuit and the finger into a pixel output signal, and the pixel output signal is associated with the first output signal.

7. The output conversion circuit according to claim 6, wherein the fingerprint identification system further comprises an amplifier connecting between the pixel array circuit and the first input end, and configured to enhance signal intensity of the pixel output signal to form the first output signal.

8. A fingerprint identification system, comprising:
a pixel array circuit, configured to receive a touch from a finger and convert a capacitance formed between the pixel array circuit and the finger into a pixel output signal;
an output conversion circuit, comprising:
  a comparator, comprising:
    a first input end, configured to receive a first output signal;
    a second input end; and
    an output end, configured to generate a comparison output signal;
  a counter, connected to the output end of the comparator, and configured to count an accumulative result of the comparison output signal to generate a second output signal; and
  a reference signal generator, connecting to the second input end, and configured to generate a reference signal, wherein the reference signal generator comprises a control circuit configured to generate a fixed voltage, a random digit generator configured to generate a random digit and an adder configured to add the fixed voltage to the random digit so that the reference signal is associated with a sum of the fixed voltage and the random digit, wherein the reference signal is a signal that varies randomly with time, and the random digit generator produces a uniform distribution of digits over time; and
a fingerprint determination module, connecting to the output conversion circuit, and configured to determine whether the pixel output signal corresponds to a finger ridge or a finger valley according to the second output signal;
wherein the first output signal is associated with the pixel output signal, and the comparator generates the comparison output signal according to the first output signal and the reference signal.

9. The finger identification system according to claim 8, wherein the reference signal generator further comprises a digital-to-analog converter, configured to convert the sum of the reference voltage and the random digit into an analog reference signal.

10. The finger identification system according to claim 8, wherein the comparison output signal is a first electric potential when the first output signal is greater than the reference signal, and the comparison output signal is a second electric potential when the first output signal is less than the reference signal.

11. The finger identification system according to claim 8, wherein the pixel array circuit comprises at least one pixel circuit.

* * * * *